United States Patent
Lee et al.

(10) Patent No.: US 8,906,719 B2
(45) Date of Patent: Dec. 9, 2014

(54) THIN FILM TRANSISTOR AND DISPLAY DEVICE USING THE SAME AND METHOD FOR MANUFACTURING THE SAME

(71) Applicant: Samsung Display Co., Ltd., Yongin (KR)

(72) Inventors: Jae-Seob Lee, Yongin (KR); Yong-Hwan Park, Yongin (KR); Young-Shin Pyo, Yongin (KR)

(73) Assignee: Samsung Display Co., Ltd., Yongin, Gyunggi-Do ( * ) Notice: Subject to any disclaimer, the term of this patent is extended or adjusted under 35 U.S.C. 154(b) by 0 days.

(21) Appl. No.: 14/186,194

(22) Filed: Feb. 21, 2014

(65) Prior Publication Data

US 2014/0170790 A1 Jun. 19, 2014

Related U.S. Application Data

(62) Division of application No. 13/115,883, filed on May 25, 2011, now Pat. No. 8,680,531.

(30) Foreign Application Priority Data

Jun. 4, 2010 (KR) .................. 10-2010-0052865

(51) Int. Cl.
*H01L 21/00* (2006.01)
*H01L 29/786* (2006.01)
*H01L 27/12* (2006.01)
*H01L 51/00* (2006.01)
*G02F 1/1333* (2006.01)

(52) U.S. Cl.
CPC ........ *H01L 27/127* (2013.01); *H01L 29/78603* (2013.01); *H01L 27/1214* (2013.01); *H01L 51/003* (2013.01); *H01L 27/1266* (2013.01); *G02F 1/133351* (2013.01)
USPC ............................................... 438/30; 438/48

(58) Field of Classification Search
CPC .............. H01L 27/127; H01L 27/1266; H01L 27/1214
USPC ....................................................... 438/30, 48
See application file for complete search history.

(56) References Cited

U.S. PATENT DOCUMENTS

| 6,034,748 | A | 3/2000 | Furuta |
| 6,165,876 | A | 12/2000 | Yamazaki et al. |
| 2005/0133793 | A1 | 6/2005 | Kim |
| 2008/0012016 | A1 | 1/2008 | Inoue et al. |
| 2009/0015760 | A1 | 1/2009 | Hattori et al. |
| 2010/0196683 | A1* | 8/2010 | Haskal .................. 428/212 |

FOREIGN PATENT DOCUMENTS

| JP | 01-158414 A | 6/1989 |
| JP | 04-280226 A | 10/1992 |
| JP | 05-206464 A | 8/1993 |
| JP | 08-204208 A | 8/1996 |

(Continued)

*Primary Examiner* — Douglas Menz
(74) *Attorney, Agent, or Firm* — Knobbe Martens Olson & Bear LLP

(57) ABSTRACT

A thin film transistor according to an example embodiment includes: a substrate body; a semiconductor layer formed on the substrate body and comprising a polycrystalline silicon film having a surface resistance from about 2000 ohm/sq to about 8000 ohm/sq; and a source electrode and a drain electrode each contacted with the semiconductor layer and comprising a metallic material having a resistance from about 350 to about 2000 ohm.

6 Claims, 3 Drawing Sheets

(56) References Cited

FOREIGN PATENT DOCUMENTS

| | | |
|---|---|---|
| JP | 10-093097 A | 4/1998 |
| JP | 11-097702 A | 4/1999 |
| JP | 2000-058472 A | 2/2000 |
| JP | 2002-031818 A | 1/2002 |
| JP | 2005-057056 A | 3/2005 |
| JP | 2005-181973 A | 7/2005 |
| JP | 2006-253490 A | 9/2006 |
| JP | 2009-021322 A | 1/2009 |
| KR | 10-1998-0081122 A | 11/1998 |
| KR | 10-2001-0017138 A | 3/2001 |
| KR | 10-2005-0082112 A | 8/2005 |
| KR | 10-2005-0103813 A | 11/2005 |
| KR | 10-0626083 B1 | 9/2006 |
| KR | 10-2008-0073941 A | 8/2008 |
| KR | 10-2008-0073942 A | 8/2008 |
| KR | 10-2009-0112116 A | 10/2009 |

* cited by examiner

THIN FILM TRANSISTOR AND DISPLAY DEVICE USING THE SAME AND METHOD FOR MANUFACTURING THE SAME

CROSS-REFERENCE TO RELATED APPLICATIONS

This application is a divisional application which claims priority under 35 U.S.C. §120 from U.S. patent application Ser. No. 13/115,883, filed on May 25, 2011 which claims priority to and the benefit of Korean Patent Application No. 10-2010-0052865 filed in the Korean Intellectual Property Office on Jun. 4, 2010, the disclosure of each of which is incorporated in its entirety.

BACKGROUND

1. Field

The described technology relates generally to a thin film transistor and a display device using the same and a method for manufacturing the same and to a thin film transistor structure capable of effectively producing a flexible display device.

2. Description of the Related Technology

A flexible display device generally uses a plastic substrate as a base substrate. However, when the plastic substrate is used, it is difficult to use a high-temperature process in manufacturing a thin film transistor used in the display device.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a thin film transistor manufactured in a comparatively low-temperature process.

Further, the described technology has been made in effort to provide a display device manufactured in a comparatively low-temperature process by using the thin film transistor.

Further, the described technology has been made in an effort to provide a method for manufacturing the display device.

An example embodiment provides a thin film transistor that includes: a substrate body; a semiconductor layer formed on the substrate body and comprising a polycrystalline silicon film having a surface resistance from about 2000 ohm/sq to about 8000 ohm/sq; and a source electrode and a drain electrode each contacted with the semiconductor layer and comprising a metallic material having a resistance from about 350 to about 2000 ohm.

The semiconductor layer contacted with each of the source electrode and the drain electrode may be in an inactivated state.

The metallic material may have a work function from about 4.1 eV to about 4.5 eV.

Another example embodiment provides a display device that includes: a substrate body; a semiconductor layer positioned on the substrate body and comprising a polycrystalline silicon film having a surface resistance from about 2000 ohm/sq to about 8000 ohm/sq; and a source electrode and a drain electrode each contacted with the semiconductor layer and comprising a metallic material having a resistance from about 350 to about 2000 ohm.

The semiconductor layer contacted with each of the source electrode and the drain electrode may be in an inactivated state.

The metallic material may have a work function from about 4.1 eV to about 4.5 eV.

In the display device, the substrate body may comprise a plastic material.

The display device may further include an organic light emitting diode formed on the substrate body.

In addition, the display device may further include a liquid crystal layer formed on the substrate body.

Further, yet another example embodiment provides a method for manufacturing a display device that includes: preparing a glass substrate; forming a substrate body comprising a plastic material on the glass substrate; forming a semiconductor layer comprising a polycrystalline silicon film on the substrate body; forming a source electrode and a drain electrode each contacted with the semiconductor layer while the semiconductor layer is inactivated; and separating the glass substrate from the substrate body.

The polycrystalline silicon film may have a surface resistance from about 2000 ohm/sq to about 8000 ohm/sq.

The source electrode and the drain electrode may comprise a metallic material having a resistance from about 350 to about 2000 ohm.

The metallic material may have a work function from about 4.1 eV to about 4.5 eV.

The semiconductor layer may be formed at temperature of less than about 400° C.

The method may further include forming an organic light emitting diode on the substrate body.

The method may further include forming a liquid crystal layer on the substrate body.

According to the example embodiments, it is possible to manufacture a thin film transistor in a comparatively low-temperature process.

Further, it is possible to manufacture a display device in the comparatively low-temperature process by using the thin film transistor.

Further, it is possible to provide an effective method for manufacturing the display device.

DETAILED DESCRIPTION

Figure 1:
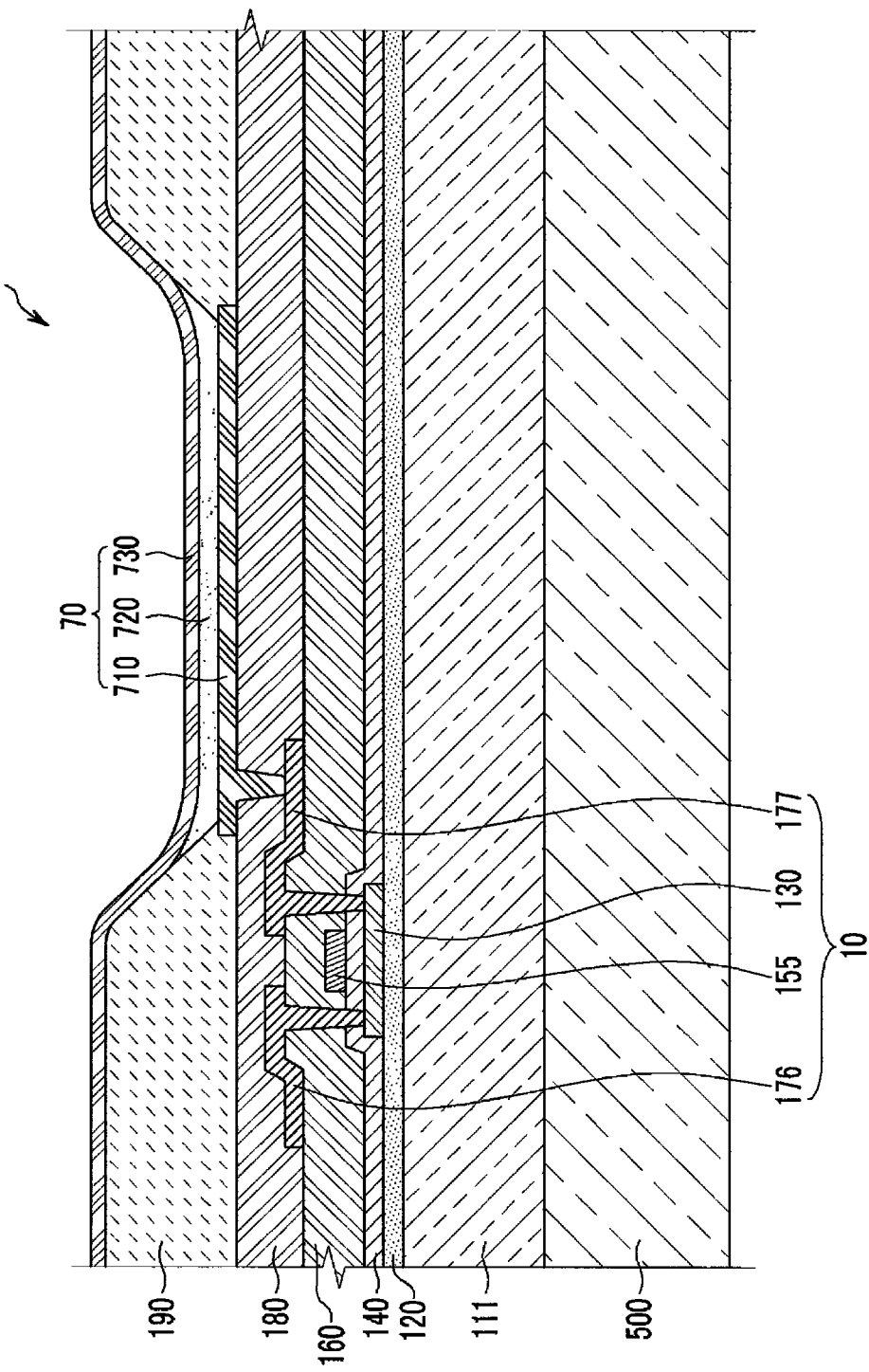
FIG. 1 is a partial cross-sectional view of a display device according to a first example embodiment.

The present embodiments will be described more fully hereinafter with reference to the accompanying drawings, in which example embodiments are shown. As those skilled in the art would realize, the described example embodiments may be modified in various different ways, all without departing from the spirit or scope of the present embodiments.

Further, like reference numerals designate like elements throughout the specification. In addition, in various embodiments, other example embodiments other than the first example embodiment will be described on the basis of components different from the first example embodiment.

The size and thickness of each component shown in the drawings are arbitrarily shown for understanding and ease of description, but the present embodiments are not limited thereto. In the drawings, the thickness of layers, films, panels, regions, etc., may be exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

Hereinafter, referring to FIG. 1, a display device 101 according to a first example embodiment will be described focusing on the structure of a thin film transistor 10.

As shown in FIG. 1, the display device 101 according to the first example embodiment includes a substrate body 111, a thin film transistor, and an organic light emitting diode 70. In the first example embodiment, the display device 101 is an organic light emitting diode display. Further, a glass substrate 500 may be used in manufacturing the display device 101.

The glass substrate 500 serves as a stable support while forming the thin film transistor 10 and the organic light emitting diode display 70 on the substrate body 111 comprising a plastic material.

The substrate body 111 comprises a flexible material, such as, for example a plastic material. Further, the substrate body 111 may be transparent depending on a usage of the display device 101.

Further, the substrate body 111 may have a thickness from about 5 to about 200 μm. When the substrate body 111 has a thickness of less than about 5 μm, the substrate body 111 is difficult to effectively support the thin film transistor 10 and the organic light emitting diode display 70. Further, the substrate body 111 is difficult to prepare with a thickness of less than about 5 μm. When the substrate body 111 is formed thicker than about 200 μm, an overall thickness of the display device 101 becomes larger, thereby deteriorating flexible characteristics.

The thin film transistor 10 according to the first example embodiment includes a semiconductor layer 130, a gate electrode 155, a source electrode 176, and a drain electrode 177.

The semiconductor layer 130 can comprise, for example, a polycrystalline silicon film. In the first example embodiment, the polycrystalline silicon film used for the semiconductor layer 130 has a surface resistance from about 2000 to about 8000 ohm/sq.

The gate electrode 155 is displayed on one region of the semiconductor layer 130. A gate insulating layer 140 is interposed between the gate electrode 155 and the semiconductor layer 130. The gate electrode 155 may comprise various conductive materials known to those skilled in the art. The gate insulating layer 140 contains at least one of tetra ethyl ortho silicate (TEOS), silicon nitride (SiNx), and silicon oxide ($SiO_2$). For example, the gate insulating layer 140 may be formed by a dual layer in which a silicon nitride layer having a thickness of 40 nm and a TEOS layer having a thickness of 80 nm are sequentially laminated. However, in the first example embodiment, the gate insulating layer 140 is not limited to the above-mentioned configuration.

Each of the source electrode 176 and the drain electrode 177 is in contact with the semiconductor layer 130 and has a resistance from about 350 to about 2000 ohm. Further, the source electrode 176 and the drain electrode 177 comprise a metallic material having a work function from about 4.1 eV to about 4.5 eV. For example, the metallic material includes aluminum (Al), zinc (Zn), and phosphorus (P).

Further, the source electrode 176 and the drain electrode 177 are spaced from each other and are insulated from the gate electrode 155. An interlayer insulating layer 160 may be interposed between the source electrode 176 and the drain electrode 177. The interlayer insulating layer 160 may comprise various insulating materials known to those skilled in the art.

Further, the semiconductor layer 130 is used in an inactivated state. For example, the source electrode 176 and the drain electrode 177 are in contact with the semiconductor layer 130 that is in the inactivated state. Accordingly, in the first example embodiment, it is possible to manufacture the thin film transistor 10 without performing an activation process which is a comparatively high-temperature process. For example, the thin film transistor 10 may generally be formed at temperature of lower than about 400° C.

As such, when the semiconductor layer 130 has a surface resistance from about 2000 ohm/sq to about 8000 ohm/sq and the source electrode 176 and the drain electrode 177 have a resistance from about 350 ohm to about 2000 ohm even though the semiconductor layer 130 that is in contact with each of the source electrode 176 and the drain electrode 177 is not activated, the thin film transistor 10 can secure minimum characteristics required for the display device 101. According to the first example embodiment, the thin film transistor 10 may have a mobility of about 50 $cm^2$/Vs or more. Further, when the metallic material having a work function from about 4.1 eV to about 4.5 eV is used, the source electrode 176 and the drain electrode 177 having the range of resistance from about 350 to about 2000 ohm may be formed.

The organic light emitting diode 70 includes a pixel electrode 710 connected with the drain electrode 176 of the thin film transistor 10, an organic emission layer 720 formed on the pixel electrode 710, and a common electrode 730 formed on the organic emission layer 720. In addition, the organic light emitting diode 70 may further include a pixel defining layer 190 defining a light emitting region with an opening exposing a part of the pixel electrode 710. The organic emission layer 720 may emit light in the opening of the pixel defining layer 190.

Further, in the first example embodiment, the structures of the thin film transistor 10 and the organic light emitting diode 70 are not limited to the structure shown in FIG. 1. The thin film transistor 10 and the organic light emitting diode 70 may have various structures within the scope which can be easily modified by those skilled in the art.

Further, the display device 101 further includes a barrier layer 120 interposed between the thin film transistor 10 and the substrate body 111. The barrier layer 120 is interposed between the semiconductor layer 130 and the substrate body 111. For example, the barrier layer 120 may be formed by a single layer of silicon nitride (SiNx) or a dual layer structure in which silicon nitride (SiNx) and silicon oxide ($SiO_2$) are laminated. The barrier layer 120 prevents an unnecessary element such as an impurity element or moisture from entering and planarizes the surface. However, the barrier layer 120 is not necessarily required and may be omitted depending on the kind of the substrate body 111 and process conditions.

The display device 101 may further include an encapsulation member (not shown) covering the organic light emitting diode 70. A thin film encapsulation or an encapsulation substrate may be used as the encapsulation member.

Further, in the first example embodiment, the display device 101 is formed on the glass substrate 500. After the thin film transistor 10 and the organic light emitting diode 70 are completed, the glass substrate 500 is finally separated from the substrate body 111.

Further, the substrate body 111 is formed to have a coefficient of thermal expansion (CTE) from about 3 ppm/° C. to about 10 ppm/° C. When the coefficient of thermal expansion of the substrate body 111 is smaller than about 3 ppm/° C. or larger than about 10 ppm/° C., a difference in coefficient of thermal expansion between the glass substrate 500 and the substrate body 111 used in manufacturing the display device 101 becomes excessively large. The glass substrate 500 has a coefficient of thermal expansion of approximately 4 ppm/° C. As such, when the difference in coefficient of thermal expansion increases, the substrate body 111 and the glass substrate 500 should be stably attached to each other in manufacturing the display device 101 are detached from each other to cause an error.

By this configuration, the thin film transistor 10 may be manufactured in a comparatively low-temperature process of less than about 400° C. Further, the display device 101 may include the thin film transistor 10 manufactured in the comparatively low-temperature process. Accordingly, it is possible to stably use the substrate body 111 comprising the plastic material in the display device 101.

Further, since the high-temperature process of about 400° C. or higher is not used in manufacturing the display device 101, it is possible to prevent the substrate body 111 and the glass substrate 500 from being detached from each other in manufacturing the display device 101.

Hereinafter, referring to FIGS. 1 and 2, the display device 101 according to the first example embodiment will be described.

Figure 2:
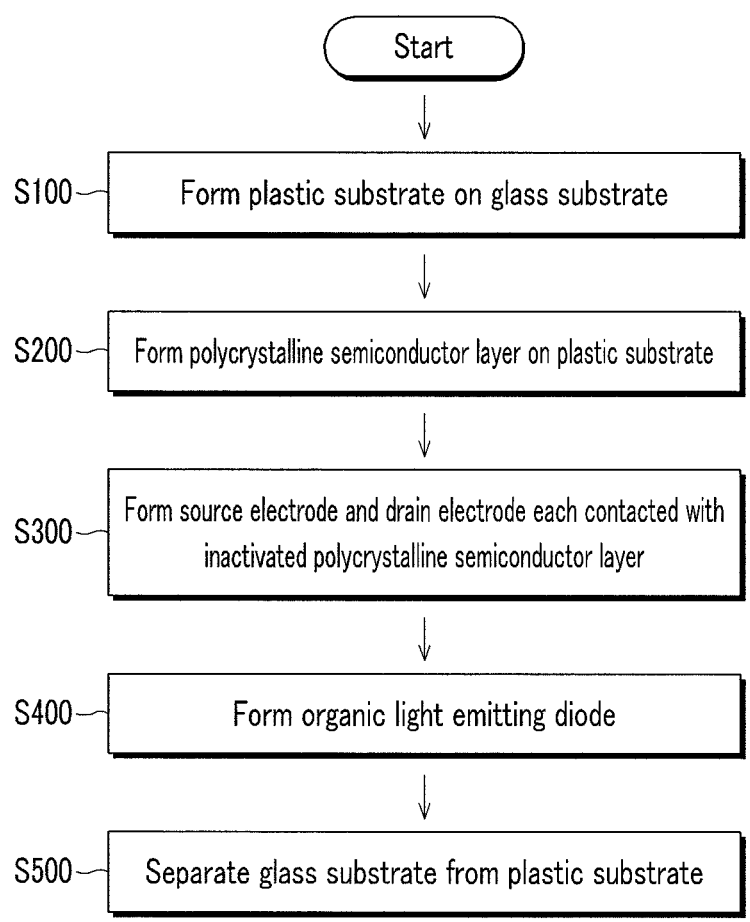
FIG. 2 is a flowchart of a method for manufacturing the display device of FIG. 1.

As shown in FIGS. 1 and 2, first, the glass substrate 500 is provided and the substrate body 111 comprising the plastic material is formed on the glass substrate 500 (S100). The substrate body 111 is formed by any one of a slit coating method and a screen printing method.

The glass substrate 500 serves as the stable support while forming the thin film transistor 10 and the organic light emitting diode display 70 on the substrate body 111 comprising the plastic material.

Further, the substrate body 111 has a thickness from about 5 to about 200 by considering a manufacturing environment or a flexible characteristic. For example, the substrate body 111 having a thickness of approximately 10 µm may comprise polyimide through the slit coating method. Further, the substrate body 111 having a thickness from about approximately 10 to about 70 µm may comprise polyimide through the screen printing method.

Further, the substrate body 111 is formed to have a coefficient of thermal expansion (CTE) equal to the coefficient of thermal expansion of the glass substrate 500 or the coefficient of thermal expansion (CTE) of about 10 ppm/° C. or lower. The glass substrate 500 has a coefficient of thermal expansion of approximately 4 ppm/° C. When the difference in coefficient of thermal expansion between the substrate body 111 and the glass substrate 500 becomes excessively large, the substrate body 111 and the glass substrate 500 that should be stably attached to each other may be detached from each other in manufacturing the display device 101. However, in the first example embodiment, since the high-temperature process of about 400° C. or higher is not used in manufacturing the display device 101, it is possible to prevent the substrate body 111 and the glass substrate 500 from being detached from each other in manufacturing the display device 101.

Next, the semiconductor layer 130 comprising a polycrystalline silicon film is formed on the substrate body 111 (S200). In this case, the semiconductor layer 130 is formed without passing through the activation process. Further, in the first example embodiment, the polycrystalline silicon film has a surface resistance from about 2000 to about 8000 ohm/sq.

Next, the gate insulating layer 140 is formed on the semiconductor layer 130 and the gate electrode 155 is formed on the gate insulating layer 140. Subsequently, the interlayer insulating layer 160 covering the gate electrode 155 is formed.

Next, each of the source electrode 176 and the drain electrode 177 are formed to be in contact with the semiconductor layer 130 which is inactivated. In this case, the source electrode 176 and the drain electrode 177 are in contact with the semiconductor layer 130 through contact holes formed on the interlayer insulating layer 160 and the gate insulating layer 140, respectively. Further, in the first example embodiment, the source electrode 176 and the drain electrode 177 comprise a metallic material having a resistance from about 350 to about 2000 ohm and a work function from about 4.1 eV to about 4.5 eV.

Next, a planarization layer 180 is formed on the source electrode 176 and the drain electrode 177 and a pixel electrode 710 is formed on the planarization layer 180. In addition, a pixel defining layer 190 having an opening for exposing a part of the pixel electrode 710 is formed on the pixel electrode 710 and the planarization layer 180.

Next, the organic light emitting diode 70 is completed by sequentially forming an organic emission layer 720 and a common electrode 730 on the pixel electrode 710.

Next, the glass substrate 500 is separated from the substrate body 111. For example, the glass substrate 500 does not include a final configuration of the display device 101.

By the manufacturing method, the thin film transistor 10 may be manufactured in a comparatively low-temperature process of less than about 400° C. Further, the display device 101 may be generally manufactured in the low-temperature process. For example, it is possible to stably manufacture the display device by using the substrate body 111 comprising the plastic material.

Further, since the high-temperature process of 400° C. or higher is not used in manufacturing the display device 101, it is possible to prevent the substrate body 111 and the glass substrate 500 from being detached from each other in manufacturing the display device 101.

Hereinafter, referring to FIG. 3, a display device 102 according to a second example embodiment will be described.

Figure 3:
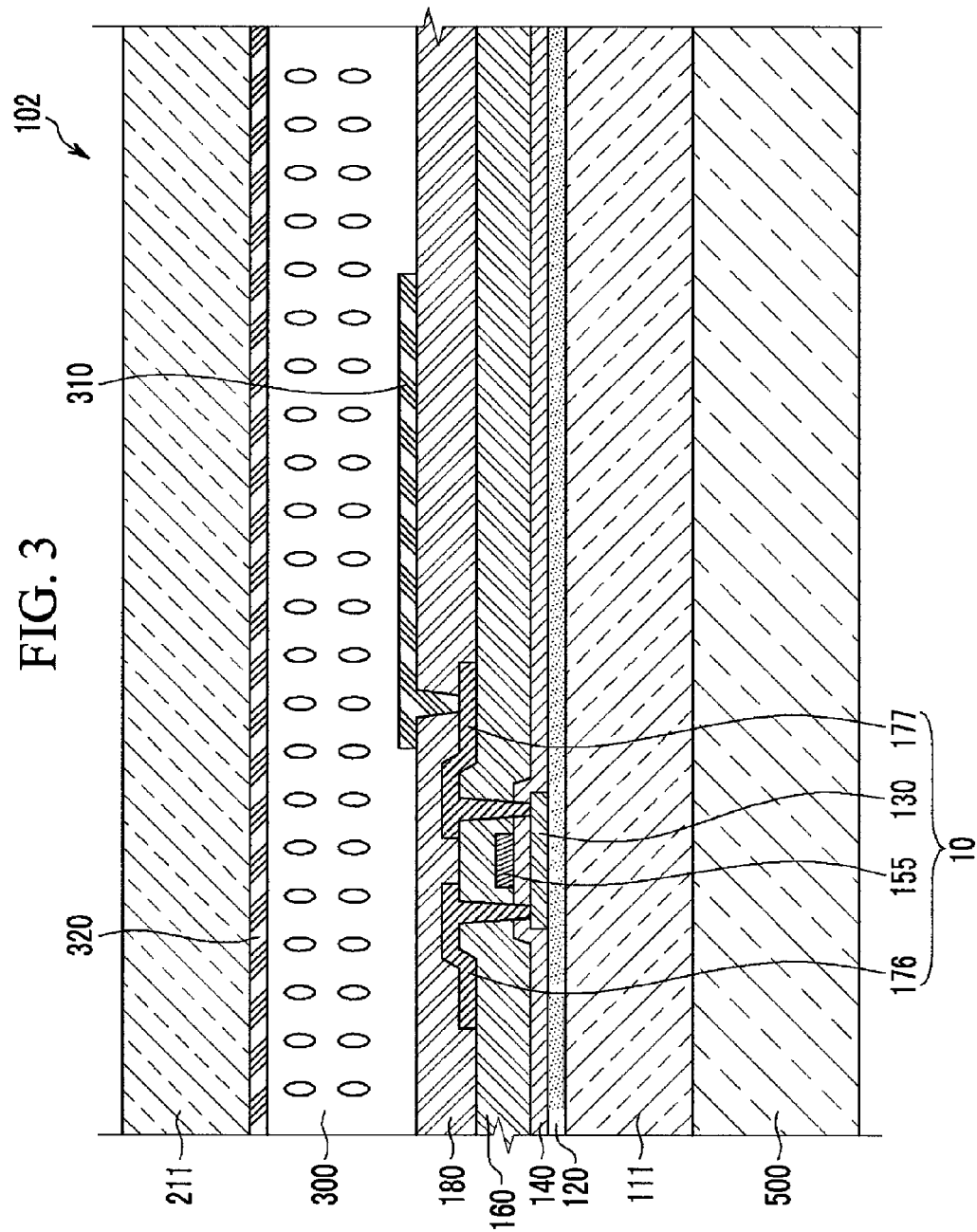
FIG. 3 is a partial cross-sectional view of a display device according to a second example embodiment.

As shown in FIG. 3, the display device 102 according to the second example embodiment is the same as the first example embodiment except for including a liquid crystal layer 300 instead of the organic light emitting diode 70 (shown in FIG. 1). For example, in the second example embodiment, the display device 102 is a liquid crystal display.

The liquid crystal layer 300 may include various liquid crystals known to those skilled in the art.

Further, the display device 101 further includes an opposing substrate 211 opposed to the substrate body 111 with the liquid crystal layer 300 interposed therebetween. The opposing substrate 211 includes a common electrode 320 facing a pixel electrode 310. Further, the display device 101 may further include polarizers (not shown) attached to the substrate body 111 and the opposing substrate 211, respectively.

In the second example embodiment, the liquid crystal layer 300 and the opposing substrate 211 are not limited a structure shown in FIG. 3. The liquid crystal layer 300 and the opposing substrate 211 may have various structures within a scope which can be easily modified by those skilled in the art.

Further, even in the second example embodiment, the glass substrate 500 shown in FIG. 3 is finally separated from the substrate body 111.

Further, the display device 102 according to the second example embodiment is the same as the first example embodiment except for a method of arranging the liquid crystal layer 300 instead of the organic light emitting diode 70 (shown in FIG. 1).

While this disclosure has been described in connection with what is presently considered to be practical example embodiments, it is to be understood that the embodiments are not limited to the disclosed embodiments, but, on the contrary, is intended to cover various modifications and equivalent arrangements included within the spirit and scope of the appended claims.

What is claimed is:

1. A method for manufacturing a display device, comprising:
    preparing a glass substrate;
    forming a substrate body comprising a plastic material on the glass substrate;
    forming a semiconductor layer comprising a polycrystalline silicon film having a surface resistance from about 2000 ohm/sq to about 8000 ohm/sq on the substrate body;
    forming a source electrode and a drain electrode, each in contact with a semiconductor layer in an inactivated state; and
    separating the glass substrate from the substrate body.

2. The method of claim 1, wherein:
    the source electrode and the drain electrode comprise a metallic material having a resistance from about 350 to about 2000 ohm.

3. The method of claim 1, wherein:
    the metallic material has a work function from about 4.1 eV to about 4.5 eV.

4. The method of claim 1, wherein:
    the semiconductor layer is formed at temperature of less than about 400° C.

5. The method of claim 1, further comprising:
    forming an organic light emitting diode on the substrate body.

6. The method of claim 1, further comprising:
    forming a liquid crystal layer on the substrate body.

* * * * *